United States Patent
Chen et al.

(10) Patent No.: US 10,015,902 B2
(45) Date of Patent: Jul. 3, 2018

(54) INTEGRATED MOVEABLE AND LOCKABLE RAIL

(71) Applicant: Quanta Computer Inc., Taoyuan (TW)

(72) Inventors: Chao-Jung Chen, Taoyuan (TW); Chih-Wei Lin, Taoyuan (TW); Chien-Wei Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 6 days.

(21) Appl. No.: 15/047,132

(22) Filed: Feb. 18, 2016

(65) Prior Publication Data
US 2017/0064859 A1 Mar. 2, 2017

Related U.S. Application Data (60) Provisional application No. 62/211,093, filed on Aug. 28, 2015.

(51) Int. Cl.
*H05K 7/14* (2006.01)

(52) U.S. Cl.
CPC ......... *H05K 7/1489* (2013.01); *H05K 7/1488* (2013.01)

(58) Field of Classification Search
CPC .. H05K 7/1401; H05K 7/1489; H05K 5/0256; H05K 7/14; H05K 7/1487; H05K 7/1488; H05K 7/16; H05K 7/183
USPC ....................................... 361/679.55; 211/26
See application file for complete search history.

(56) References Cited

U.S. PATENT DOCUMENTS

| | | | | |
|---|---|---|---|---|
| 4,154,399 A | * | 5/1979 | Riano | F23D 11/383 239/139 |
| 6,702,412 B2 | * | 3/2004 | Dobler | A47B 88/407 312/205 |
| 6,938,967 B2 | * | 9/2005 | Dubon | H05K 7/1421 312/330.1 |
| 8,033,621 B2 | | 10/2011 | Liang | |
| 9,237,671 B2 | * | 1/2016 | Chen | H05K 7/1489 |

(Continued)

OTHER PUBLICATIONS

TW Office Action for Application No. 105111630, dated Sep. 25, 2017, w/ First Office Action Summary.

(Continued)

*Primary Examiner* — Dimary Lopez Cruz
*Assistant Examiner* — Ingrid Wright
(74) *Attorney, Agent, or Firm* — Nixon Peabody LLP; Eduardo J. Quinones; Zhou Lu (57) ABSTRACT

An integrated lockable shelf rail configured to operate in pairs to support an electronic component is provided. The rail includes a front bracket to attach to a first vertical support and having a forward facing first plate, and a track assembly to be coupled to the front bracket. The track assembly includes a forward facing second plate to overlap with and couple to the first plate, a longitudinally extending C-shaped track member, and moveable arm arms slideably nested in the track member. The track assembly also includes a shelf bracket including a support surface to support the electronic component, a first side plate configured to couple to the second arm, and a forward facing third plate to overlap with the second plate. A hole in each of the first, second and third plates which, when the first, second and third plates overlap, collectively define a common hole to receive a fastener.

18 Claims, 13 Drawing Sheets

(56) References Cited

U.S. PATENT DOCUMENTS

| 9,328,769 B1 * | 5/2016 | Chen .................... H05K 7/1489 |
| 2002/0158556 A1 * | 10/2002 | Cheng .................. H05K 7/1489 |
| | | 312/333 |
| 2015/0136722 A1 | 5/2015 | Chen et al. |

OTHER PUBLICATIONS

TW Search Report for Application No. 105111630 (report conducted Aug. 31, 2017) mailed with first Office Action dated Sep. 25, 2017.

* cited by examiner

INTEGRATED MOVEABLE AND LOCKABLE RAIL

CROSS REFERENCE TO RELATED APPLICATIONS

The instant application claims priority to U.S. Provisional Application No. 62/211,093 entitled "Integrated Rail Mechanism", filed Aug. 28, 2015, the contents of which is expressly incorporated by reference in its entirety.

FIELD OF THE INVENTION

The various embodiments described herein relate generally to rails for supporting a component on a server rack support. More specifically, various embodiments described herein generally relate to an integrated rail mechanism that can lock a component in place and unlock to allow the component to slide into and out of the server rack.

BACKGROUND

Large-scale computing facilities typically organize and house numerous electronic devices such as servers, switches, routers, power supplies, etc., in server racks. Generally, dimensions for server racks as well as underlying support structures are standardized. For example, a typical server rack includes a rectangular housing or frame including vertical support rails or posts positioned in respective corners of the rectangular housing with various interconnecting support brackets that secure the vertical support rails together and provide overall structural integrity. Further, each vertical support rail typically includes predefined openings, or mounting holes, spaced at standard intervals along its length that receive screws or other fasteners of one or more electronic devices, including device mounting structures. In this fashion, a horizontal alignment of the predefined openings for each vertical support rail forms a slot or mount location for corresponding electronic devices. In turn, electronic devices are typically stacked in a shelf-like manner in respective slots of the server housing. Notably, electronic devices (including device mounting structures) are typically dimensioned to mount in respective slots of the server housing in a particular orientation—e.g., an electronic device is often mounted in a slot by sliding its rear side first into the slot to orient Input/Output (I/O) ports toward a rear side of the server rack, fastening the rear side to rear vertical support rails, and fastening a front side (e.g., opposite the rear side) to front vertical support rails.

The electronic device is often secured to both the front vertical support rails and rear vertical support rails by fasteners, which may also complicate efficient access and/or removal of the electronic device. However, in certain circumstances (e.g., maintenance, repair, removal, etc.), it may be desirable to withdraw the electronic device from the server rack.

SUMMARY OF THE INVENTION

According to an embodiment of the invention, an integrated lockable shelf rail configured to operate in pairs to support an electronic component is provided. The rail includes a front bracket configured to attached to a first vertical support and having a forward facing first plate, and a track assembly configured to be coupled to the front bracket. The track assembly includes a forward support having a forward facing second plate configured to overlap with the first plate, a longitudinally extending inwardly facing C-shaped track member, and first and second moveable arm arms slideably nested in the track member. The track assembly also includes a shelf bracket including a support surface configured to support the electronic component, a first side plate configured to couple to the second arm, and a forward facing third plate configured to overlap with the second plate. A hole in each of the first, second and third plates which, when the first, second and third plates overlap, collectively define a common hole. When the rail is in an assembly state and a first fastener is inserted into the common hole through the first, second and third plates, the first fastener secures the shelf bracket.

The above embodiment may have various features. The support surface can extend forward of the third plate, and have a hole configured to receive a second fastener such that the fastener at least partially extends above the support surface, where when the second fastener is in the hole of the support surface and an electronic component is mounted on the support surface, the fastener prevents the electronic component from being laterally removed from a front of the shelf bracket. The first fastener may be a threaded fastener, and the hole in the first and/or second plates may be threaded. The shelf bracket may have a second side plate extending upwardly from the support surface, the side plate being configured to provide a lateral support to the electronic component. The track assembly may include a front support that includes the first plate, and extends reward from the front plate to define a substantially C-shaped cavity that couples to the track member. The rear bracket may be configured to attach to a second vertical support and having a rear facing plate, and the track assembly may be configured to couple to the rear facing plate of the rear bracket. The first and second plates each may include a plurality of holes, one of which is part of the common hole, and at least one other of which overlap and are configured to receive a third fastener to couple the first plate to the second plate. A rear support may be configured to mounted on the rear bracket, an arm may be connected to the rear support, a longitudinally extending outward facing C-shaped track member may be connected to the inwardly facing C-shaped track member, and an arm may be slideably engaged with the outward facing C-shaped track member, where the slideable engagement allows the rear support to move relative to the front support such that the track assembly has an adjustable length.

According to another embodiment of the invention, a server rack is provided. The server rack includes first, second, third and fourth vertical supports defining a rack chamber, an electronic component, and a pair of integrated lockable shelf rails supporting the electronic component. Each rail includes a front bracket attached to a first vertical support and having a forward facing first plate, and a track assembly coupled to the front bracket. The track assembly includes a forward facing second plate overlapping with and coupled to the first plate, a longitudinally extending C-shaped track member, and first and second moveable arms slideably nested in the track member. The track assembly also includes a shelf bracket including a support surface supporting the electronic component, a first side plate coupled to the second arm, and a forward facing third plate overlapping with the second plate. A hole in each of the first, second and third plates overlaps to collectively define a common hole. When a first fastener is inserted into the common hole through the first, second and third plates, the first fastener secures the shelf bracket.

The above embodiment may have various optional features. The support surface may extend forward of the third plate, the support surface having a hole configured to receive a second fastener such that the fastener at least partially extends above the support surface, and when the second fastener is in the hole of the support surface and an electronic component is mounted on the support surface, the fastener prevents the electronic component from being laterally removed from a front of the shelf bracket. The first fastener may be a threaded fastener, and the hole in the first and/or second plates may be threaded. The shelf bracket may have a second side plate extending upwardly from the support surface, the second side plate being configured to provide a lateral support to the electronic component. The track assembly may include a front support that includes the first plate, and extends reward from the front plate to define a substantially C-shaped cavity that couples to the track member. A rear bracket may be attach to a second vertical support and have a rear facing plate, and the track assembly may be coupled to the rear facing plate of the rear bracket. The first and second plates each may include a plurality of holes, one of which is part of the common hole, and at least one other of which overlap and are configured to receive a third fastener to couple the first plate to the second plate.

Details of one or more implementations are set forth in the accompanying drawings and the description below. Other features, aspects, and potential advantages will be apparent from the description and drawings, and from the claims.

BRIEF DESCRIPTION OF THE DRAWINGS

Various embodiments in accordance with the present disclosure will be described with reference to the drawings, in which.

DETAILED DESCRIPTION

In the following description, various embodiments will be illustrated by way of example and not by way of limitation in the Figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Several definitions that apply throughout this disclosure will now be presented. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like. The term "a" means "one or more" unless the context clearly indicates a single element.

As used herein, the term "front", "rear", "left" and "right" or other terms of direction, orientation, and/or relative position are used for explanation and convenience to refer to certain features of this disclosure. However, these terms are not absolute, and should not be construed as limiting this disclosure.

Figure 1:
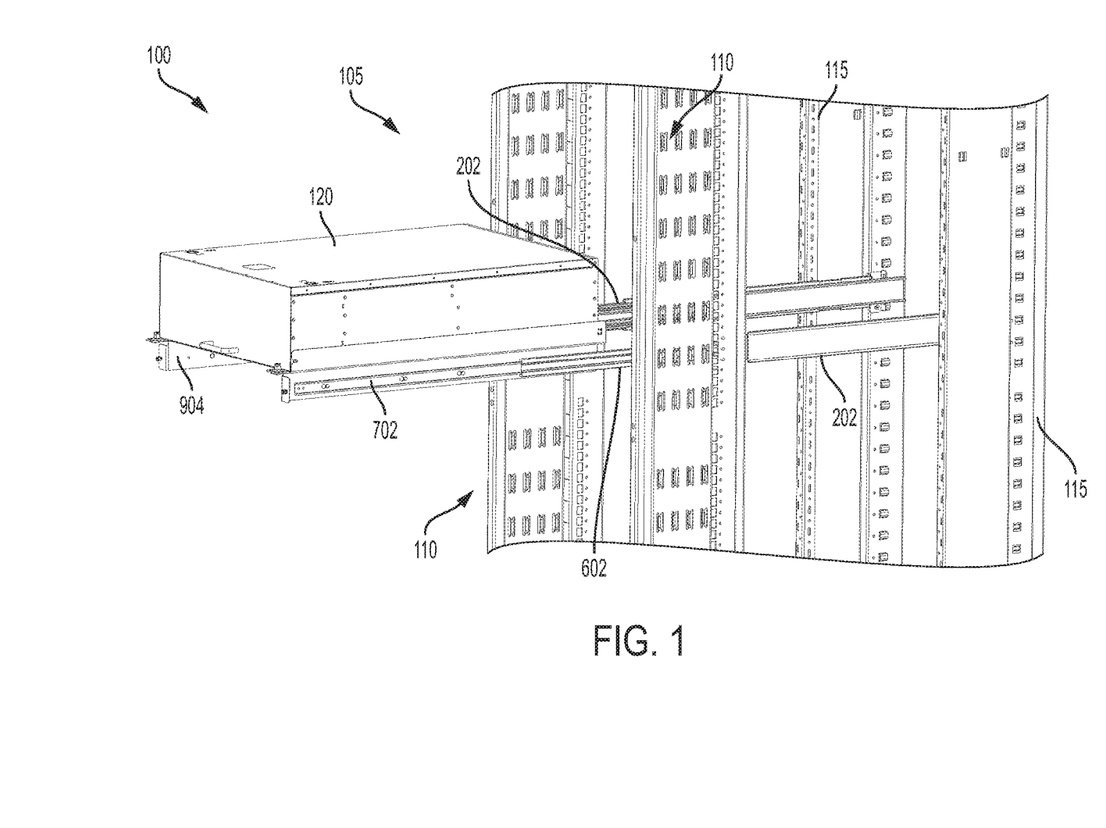
FIG. 1 is a perspective view of a pair of rails according to an embodiment of the invention in a deployed state.

FIG. 1 illustrates a server system 100 having a server housing 105. As discussed herein, the front side of server housing 105 is defined, in part, by a plane formed by a pair of front rails 110, and the rear side of server housing 105 is defined, in part, by a plane formed by a pair of rear rails 115. Rails 110 and rails 115 serve as vertical supports or posts for server housing 105 and are typically interconnected by various brackets for structural integrity. In addition, rails 110 and 115 include openings, apertures, or mounting holes configured to align with corresponding mounting holes on electronic devices and/or mounting structures for electronic devices.

A pair of vertical shelf rails 202, comprising a left rail and a right rail, are interconnected between rails 110 and 115. Each rail 202 couples to a pair of a respective front rail 110 and a rear rail 115 to form retractable and extendable shelves that can couple to an electronic device such as an electronic device 120. Notably, electronic device 120 is illustrated as a switch, but it is appreciated that any number of electronic devices (e.g., servers, routers, power supplies, etc.) may be substituted as appropriate.

The left and right rails 202 are symmetrical. For ease of discussion the internal architecture of rails 202 will be discussed with respect to the left rail, but it is to be understood that the right rail has a symmetrical design to the left rail.

Figure 2A:
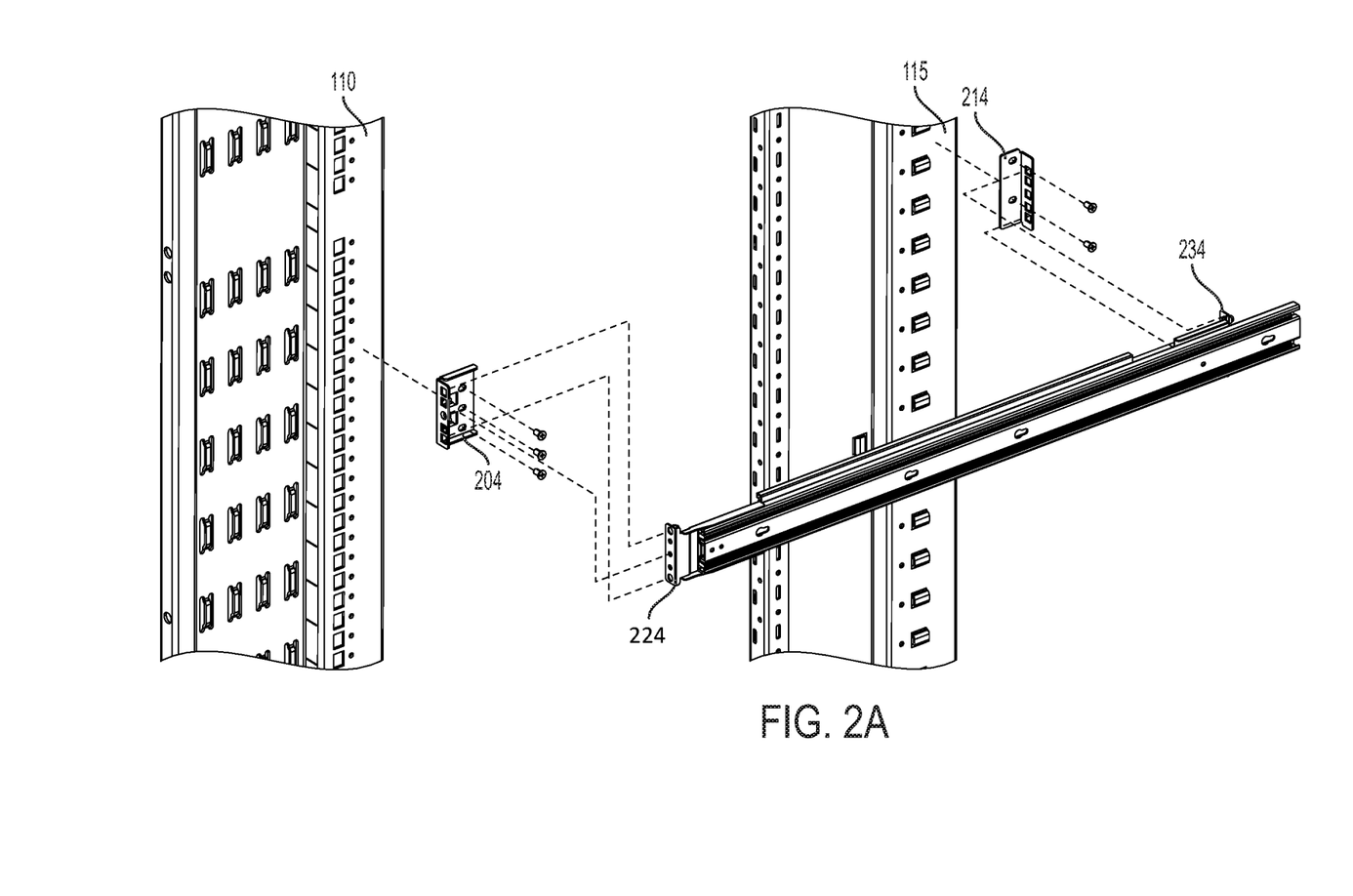
FIG. 2A is an exploded view of a rail according to the embodiment of FIG. 1.
Figure 3A:
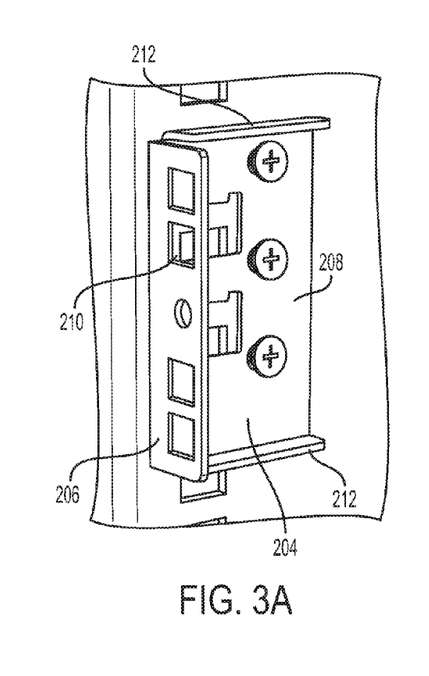
FIGS. 3A and 3B are perspective views of inner forward components of the rail according to the embodiment of FIG. 1.

Referring now to FIGS. 2A and 3A, rail 202 includes a front bracket 204 having a front plate 206 and a side plate 208. Side plate 208 has holes and/or fasteners as is known in the art to attach front bracket 204 to a front rail 110. Front plate 206 has holes 210. Top and bottom flanges 212 extended inward to provide rigidity and a gripping surface.

Figure 3B:
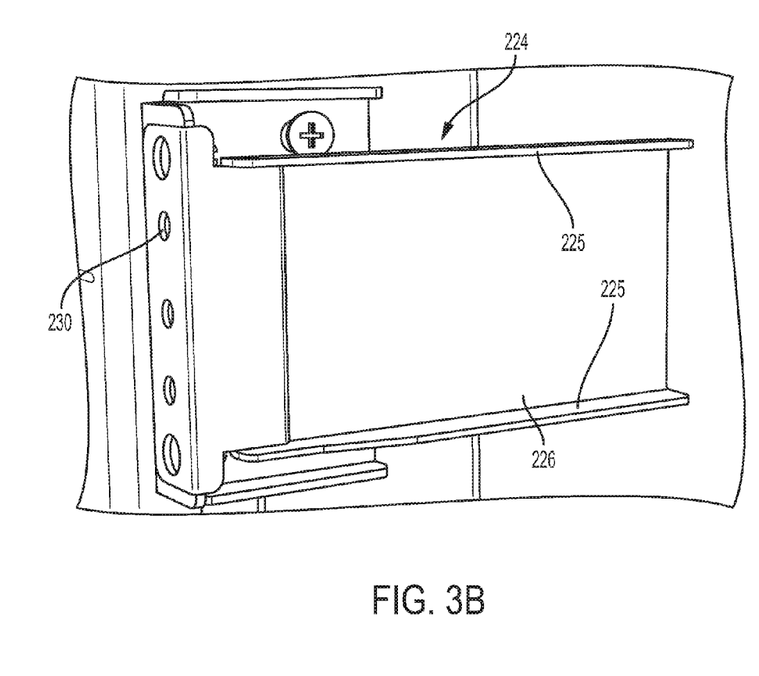
Figure 3C:
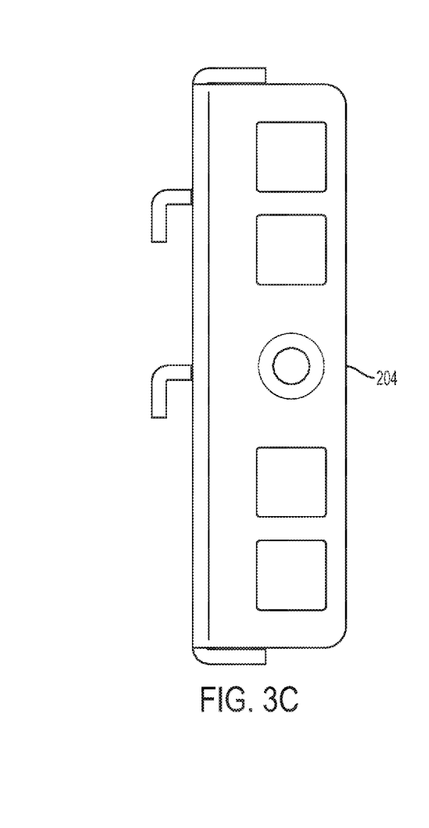
FIGS. 3C and 3D are top and front views of inner forward components of the rail according to the embodiment of FIG. 1.
Figure 3D:
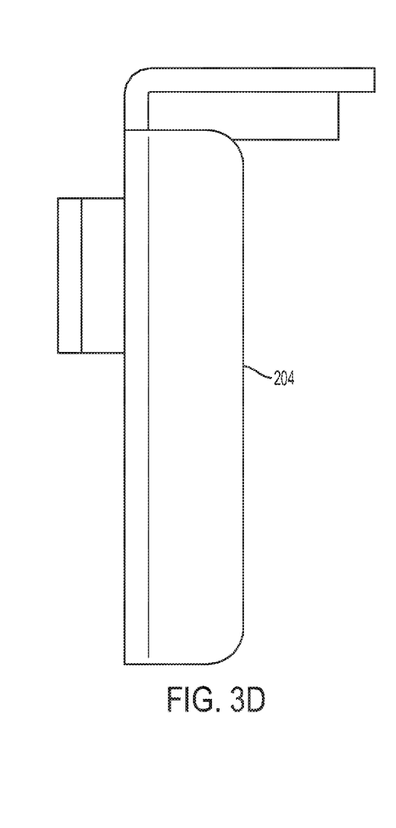

Referring now also to FIG. 3B, a forward support 224 has a recess portion 226 defined by inwardly facing flanges 225 and a front plate 228 with holes 230 at least partially corresponding to and aligned with holes 210 of front bracket 204. Forward support 224 is mounted to forward bracket 204 by fasteners as known in the art (e.g., screws, bolts, and slotted pins) through overlapping holes 210 and 230, preferably through rivet pins through the topmost and bottom-most holes. At least one overlapping hole in holes 210 and holes 230 remains unoccupied to receive another fastener as described herein.

Figure 4A:
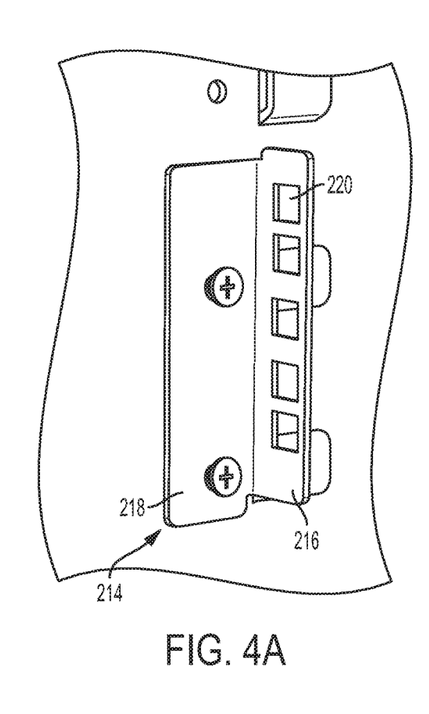
FIGS. 4A and 4B re perspective views of inner rear components of the rail according to the embodiment of FIG. 1.

Referring now to FIGS. 2A and 4A, rail 202 also includes a rear bracket 214. Rear bracket 214 includes a rear plate 216 and a side plate 218. Side plate 218 has holes and/or fasteners as is known in the art to attach rear bracket 214 to a rear rail 115. Rear plate 216 will also have several holes 220.

Figure 2B:
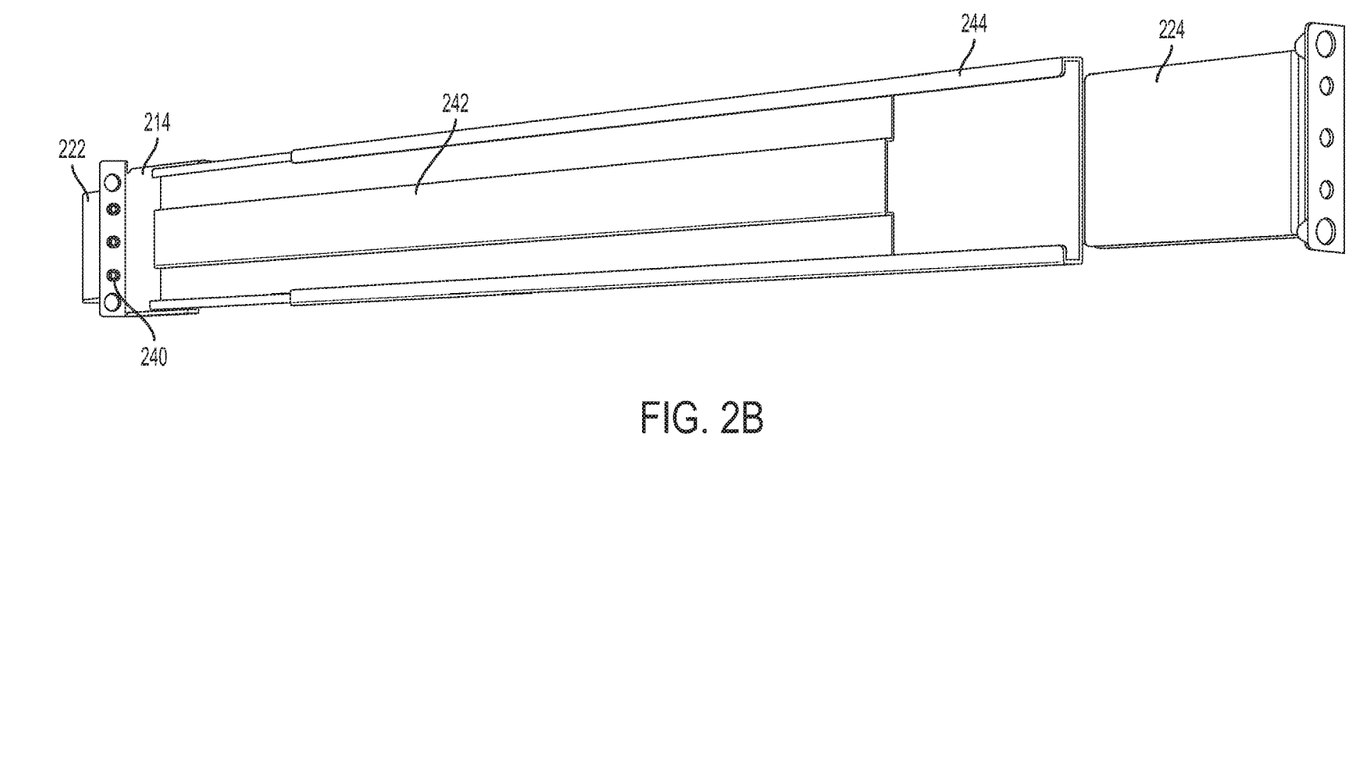
FIG. 2B is a perspective view of the rail according to the embodiment of FIG. 1.
Figure 4B:
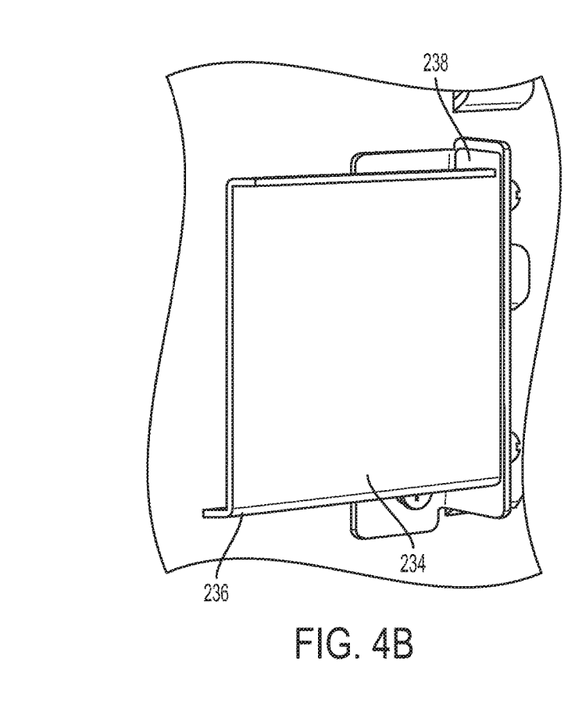
Figure 4C:
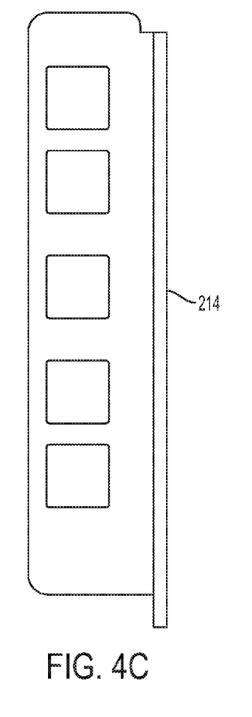
FIGS. 4C and 4D are top and front views of inner rear components of the rail according to the embodiment of FIG. 1.
Figure 4D:
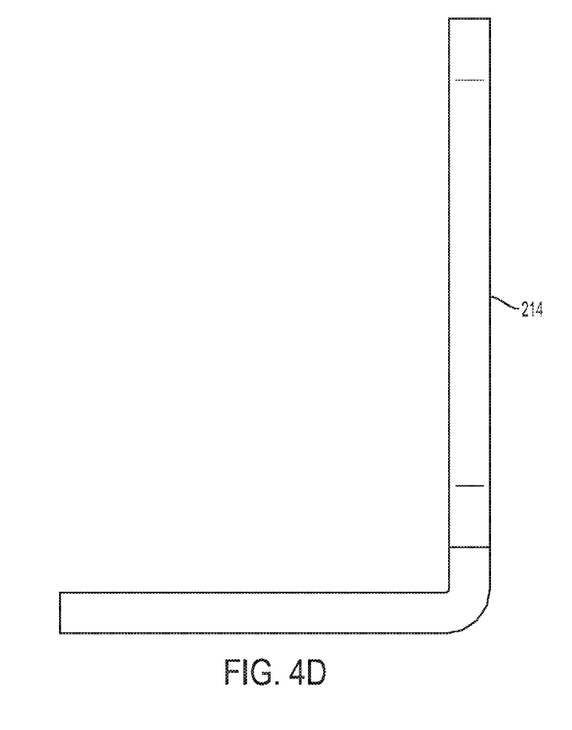

Referring now to FIGS. 2B and 4B, rail 202 also includes a rear support 234 having a bottom ledge 236, and a back plate 238 with holes 240 (FIG. 8) at least partially corresponding to holes 230 of rear bracket 214. Rear support 234 is mounted to rear bracket 214 by fasteners as is known in the art through overlapping holes 220 and 240, preferably through rivet pins through the topmost and bottom most holes.

Figure 5:
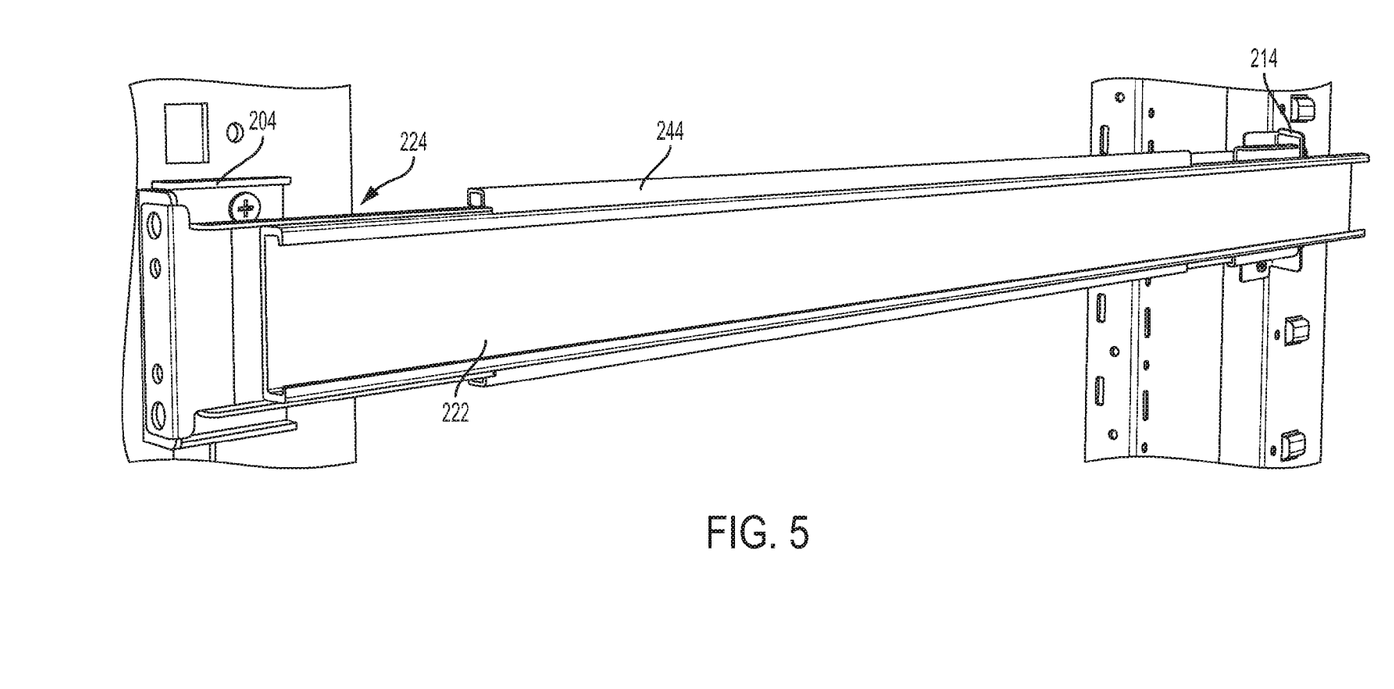
FIGS. 5, 6 and 7 are perspective views of internal components of the rail according to the embodiment of FIG. 1.

Referring now to FIGS. 2B and 5, a static C-shaped track 222 rests on flange 212 of forward support 224, and is preferably connected together by rivets (not shown). The rear end of track 222 extends beyond rear bracket 214 and rests against side plate 218; side plate 218 was a width equal to that set by front bracket 204 and front support 224 so that track 222 is parallel with the front to back direction of the server system 100. A C-shaped side support 244 is mounted on the opposite side of track 222, preferably by rivets (not shown). By these connections, track 222, forward support 224 and side support 224 generally form a connected solid structure.

An arm 242 has a rear end mounted on rear support 234, preferably by rivets (not shown). By this connection, rear support 234 and arm 242 generally form a connected solid structure. The other end of arm 242 is inserted in and slideably mounted in the C track of side support 244. Preferably a sufficiently length of arm 242 is inserted into the track of side support 244 to prevent any meaningful sag between components.

The various components form a stable support structure between rear rail 115 and front rail 110. The sliding engagement of arm 242 in track 222 allows for adjustable length to account for different distances between rails 110 and 115, as well as providing for ease of assembly. By way of non-limiting example, the front and rear brackets 204 and 214 are initially mounted on the rails. The rear support 234 with connected arm 242 is mounted on the rear bracket 234. The combination of the side support 244, track 222 and front support 224 are then mounted on arm 242 by sliding the C track of side support 244 over arm 242. Front support 224 is then aligned with and connected to the front of front bracket 204.

Figure 6:
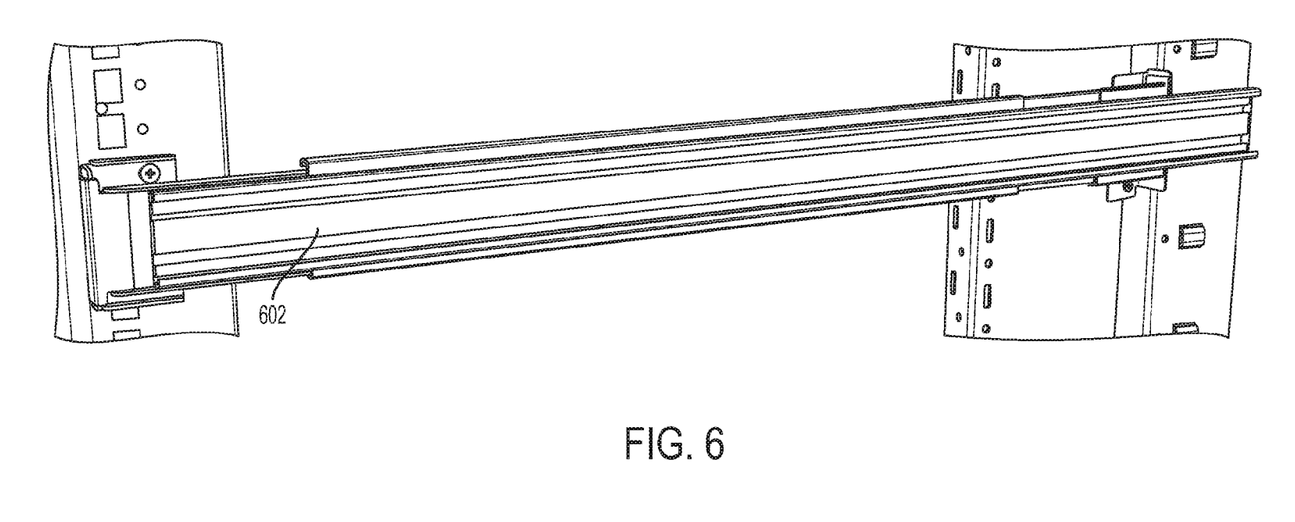
Figure 8:
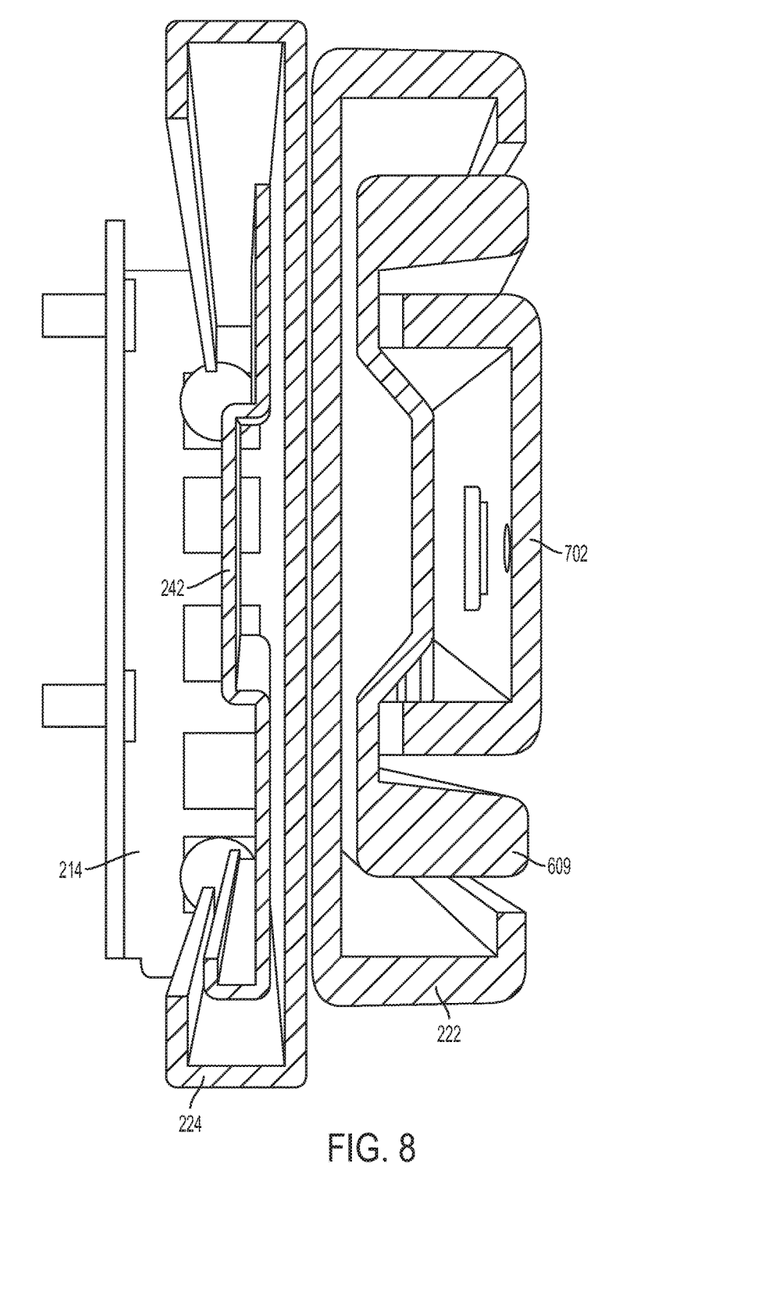
FIG. 8 is a front view of internal components of the rail according to the embodiment of FIG. 1.

Referring now to FIGS. 6 and 8, a first telescoping arm 602 is slideably mounted within track 222. Arm 602 can be withdrawn from track 222 to extend beyond housing 105. FIG. 6 shows arm 602 in its fully retracted position, and FIG. 1 shows arm 602 in its fully extended position. Stops (not shown) as are known in the art may be provided to prevent/limit removal of arm 602 from track 222.

Figure 7:
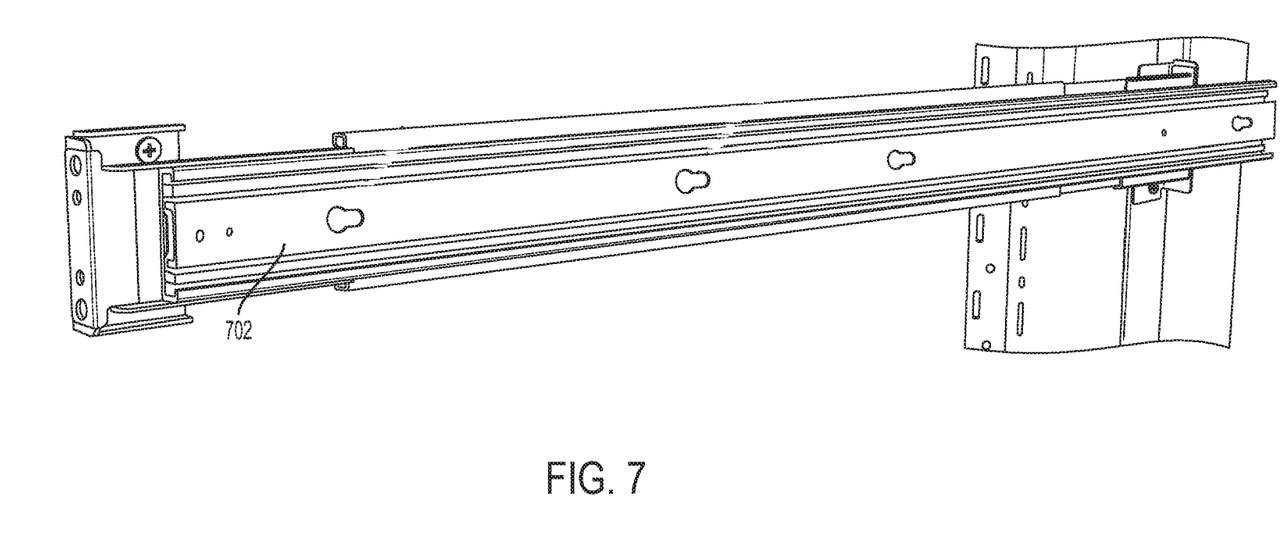

Referring now to FIGS. 7 and 8, a second telescoping arm 702 is slideably mounted and nested within first telescoping arm 602. Arm 702 can withdraw from arm 602, such that arms 602 and 702 collectively extend beyond housing 105. FIG. 7 shows arm 702 in its fully retracted position, and FIG. 1 shows arm 702 in its fully extended position. Stops (not shown) as are known in the art may be provided to prevent/limit removal of arm 702 from arm 602.

Figure 9:
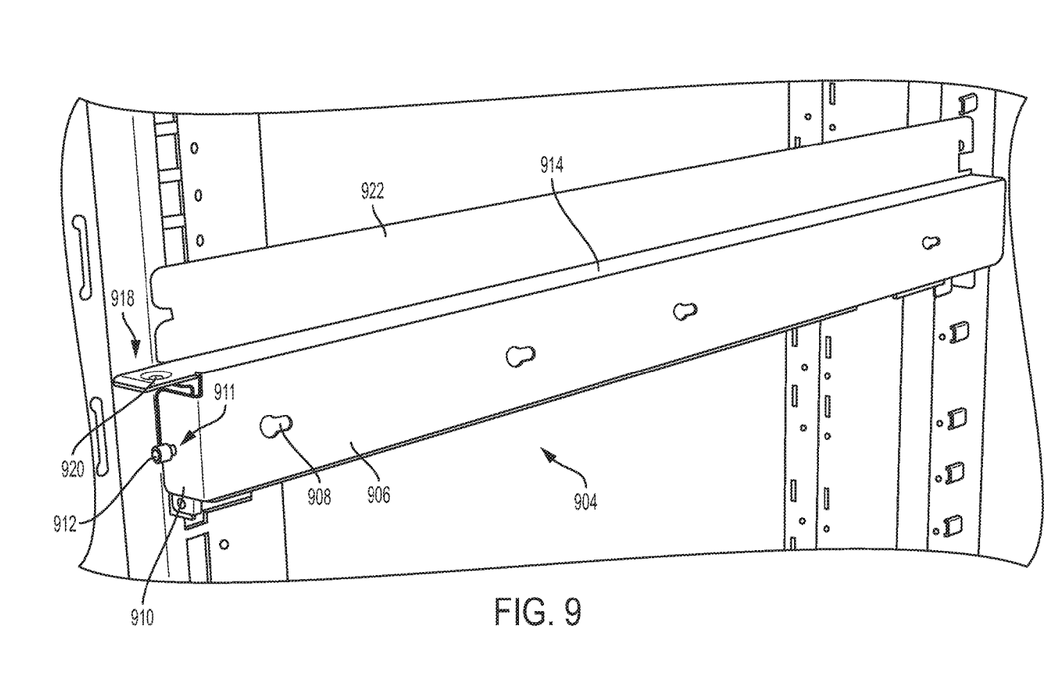
FIG. 9 is a perspective view of the rail according to the embodiment of FIG. 1.

Referring now to FIG. 9, moveable shelf bracket 904 is mounted over track 222. Shelf bracket 904 has a side plate 906 with screw holes through which fasteners 908 extend into and connect to second telescoping arm 702. Shelf bracket 904 is thus mounted to arm 702 and can deploy from and retracts into housing 105 with arm 702. FIG. 9 shows shelf bracket 904 in its fully retracted position, and FIG. 1 shows shelf bracket 904 in its fully extended position.

Shelf bracket 904 includes a front plate 910 that extends outward from the side plate 906. Front plate 910 has a hole 911 (occupied in FIG. 9 by a fastener 912). Front plate 910 overlaps forward support 224 and forward bracket 204 such that hole 911 in the front plate 910 overlaps at least one unoccupied hole from holes 210 and at least one unoccupied hole from holes 230. A fastener 912, such as a thumb screw, pin or other plunger is insertable into the overlap of holes to releasably secure side plate 206 to front support 224, to thereby lock shelf bracket 904 in place. Removal of fastener 912 unlocks the shelf bracket 904, and allows it to be withdrawn from and retracted into housing 105.

To the extent that the embodiment uses a threaded fastener 912, then at least one of the holes 210 and 230 are preferably threaded to receive and lock with fastener 912. However the invention is not so limited, and other forms of insertion connection may be used.

Figure 10:
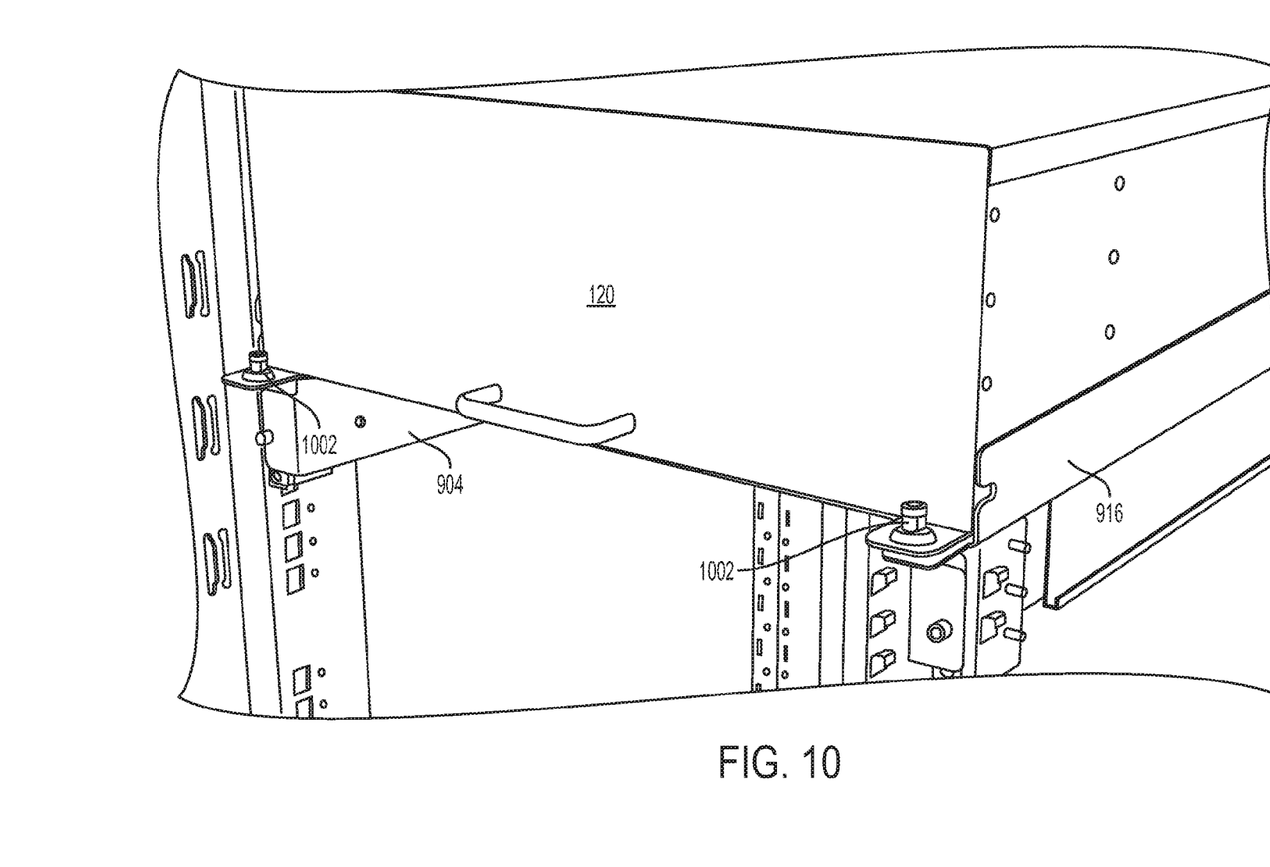
FIG. 10 is a perspective view of a pair of rails according to the embodiment of FIG. 1 supporting a component.

Referring now to FIGS. 9 and 10, shelf bracket 904 also includes a horizontal support surface 914 that extends from the top of side plate 906, and then an upwardly extending plate 922. Support surface 914 supports electronic component 120, and plate 922 is a side rail to prevent lateral movement of electronic component 120.

Support surface 914 extends past front plate 910 to define a ledge 918. Ledge 918 includes a hole 920, which can be filled with a removable fastener 1002. Removable fastener 1002 when present prevents electronic component 120 from being withdrawn from server 105 when shelf bracket 904 is locked. To the extent that removable fastener 1002 is threaded, then hole 920 may have an internal mating thread.

The above embodiments provide two different ways to lock and remove electronic component 120 from housing 105. First, fastener 912 locks shelf bracket 904 and a mounted electronic component 120 into a retracted position within housing 105, and its removal allows for telescope extension of electronic component 120 out of housing 105 via arms 602 and 702. Second, when fastener 912 is locked, fastener 912 provides an alternative to directly remove electronic component 120 from housing 105 without using the telescopic features of the design.

The ability of any of the above embodiments to secure or otherwise lock components into particular positions is to be understood to include the potential for mechanical play in the components. Thus for example when shelf bracket 904 is secured by fastener 912, it cannot be removed from server housing 105, but there may be a degree of permissible motion (e.g., ±0.5 inch) between components.

In the above embodiment, the electronic component 120 is not connected to rail 202, and fastener 1002 acts as a physical stop that prevents longitudinal (back to front) withdrawal of the electronic component from the server housing 105; in other words, electronic component cannot be slid off of the front of shelf bracket 904. In the alternative, electronic component may be connected to shelf bracket 904. By way of non-limiting example, the electronic component 120 may have its own flange with hole that overlaps hole 920 of ledge 918, such that fastener 1002 secures component 202 to shelf bracket 904; this prevents any withdrawal (including sliding withdrawal). However, the invention is not so limited, and other forms of connection could be used.

The above embodiments describe rails 202 in an assembled state with housing 105. However, the invention is not so limited, and the invention also includes various combinations of components prior to assembly, mid-assembly, and/or full assembled.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. An integrated lockable shelf rail configured to operate in pairs to support an electronic component, the rail comprising:
   a front bracket configured to attach to a first vertical support and having a forward facing first plate;
   a track assembly configured to be coupled to the front bracket, the track assembly including:
      a forward support having a forward facing second plate configured to overlap with the first plate;
      a longitudinally extending inwardly facing C-shaped track member; and
      first and second telescoping arms slideably nested in the track member;
   a shelf bracket including a horizontal support surface configured to support the electronic component, a first side plate configured to couple to the second arm, a forward facing third plate configured to overlap with the second plate, and an upwardly extending fourth plate; and
   a hole in each of the first, second and third plates which, when the first, second and third plates overlap, collectively define a common hole;
   wherein when the rail is in an assembly state and a first fastener is inserted into the common hole through the first, second and third plates, the first fastener secures the shelf bracket;
   wherein the horizontal support surface extends from the top of the first side plate and supports the electronic component; and
   wherein the upwardly extending fourth plate is a side rail to prevent a lateral movement of the electronic component.

2. The rail of claim 1, further comprising:
   the support surface extending forward of the third plate, the support surface having a hole configured to receive a second fastener such that the fastener at least partially extends above the support surface;
   wherein when the second fastener is in the hole of the support surface and an electronic component is mounted on the support surface, the fastener prevents the electronic component from being laterally removed from a front of the shelf bracket.

3. The rail of claim 1, wherein the first fastener is a threaded fastener, and the hole in the first and/or second plates is threaded.

4. The rail of claim 1, wherein the shelf bracket has a second side plate extending upwardly from the support surface, the side plate being configured to provide a lateral support to the electronic component.

5. The rail of claim 1, wherein the track assembly includes a front support that includes the first plate, and extends reward from the front plate to define a substantially C-shaped cavity that couples to the track member.

6. The rail of claim 1, further comprising:
   a rear bracket configured to attach to a second vertical support and having a rear facing plate; and
   the track assembly being configured to couple to the rear facing plate of the rear bracket.

7. The rail of claim 6, further comprising:
   a rear support configured to mounted on the rear bracket;
   an arm connected to the rear support;
   a longitudinally extending outward facing C-shaped track member connected to the inwardly facing C-shaped track member; and
   the arm being slideably engaged with the outward facing C-shaped track member;
   wherein the slideable engagement allows the rear support to move relative to the front support such that the track assembly has an adjustable length.

8. The rail of claim 1, wherein the first and second plates each include a plurality of holes, one of which is part of the common hole, and at least one other of which overlap and are configured to receive a third fastener to couple the first plate to the second plate.

9. The rail of claim 1, wherein the horizontal support surface extends past the forward facing third plate to define a ledge.

10. The rail of claim 9, wherein the ledge includes a second hole to facilitate a second fastener, and wherein when the first fastener is inserted into the common hole, the second fastener prevents the electronic component from being withdrawn.

11. A server rack, comprising:
   first, second, third and fourth vertical supports defining a rack chamber;
   an electronic component;
   a pair of integrated lockable shelf rails supporting the electronic component, each rail comprising:
      a front bracket attached to a first vertical support and having a forward facing first plate;
      a track assembly coupled to the front bracket, the track assembly including:
         a forward support having a forward facing second plate overlapping with and coupled to the first plate;
         a longitudinally extending C-shaped track member; and
         first and second telescoping arms slideably nested in the track member;
      a shelf bracket including a horizontal support surface supporting the electronic component, a first side plate coupled to the second arm, a forward facing third plate configured to overlap with the second plate, and an upwardly extending fourth plate; and
      a hole in each of the first, second and third plates overlapping to collectively define a common hole;
      wherein when a first fastener is inserted into the common hole through the first, second and third plates, the first fastener secures the shelf bracket;
      wherein the horizontal support surface extends from the top of the first side plate and supports the electronic component; and
      wherein the upwardly extending fourth plate is a side rail to prevent a lateral movement of the electronic component.

12. The server rack of claim 11, further comprising:
   the support surface extending forward of the third plate, the support surface having a hole configured to receive a second fastener such that the fastener at least partially extends above the support surface;
   wherein when the second fastener is in the hole of the support surface and an electronic component is mounted on the support surface, the fastener prevents the electronic component from being laterally removed from a front of the shelf bracket.

13. The server rack of claim 11, wherein the first fastener is a threaded fastener, and the hole in the first and/or second plates is threaded.

14. The server rack of claim 11, wherein the shelf bracket has a second side plate extending upwardly from the support surface, the second side plate being configured to provide a lateral support to the electronic component.

15. The server rack of claim 11, wherein the track assembly includes a front support that includes the first plate, and extends reward from the front plate to define a substantially C-shaped cavity that couples to the track member.

16. The server rack of claim 11, further comprising:
a rear bracket attached to a second vertical support and having a rear facing plate; and
the track assembly coupling to the rear facing plate of the rear bracket.

17. The server rack of claim 11, wherein the first and second plates each include a plurality of holes, one of which is part of the common hole, and at least one other of which overlap and are configured to receive a third fastener to couple the first plate to the second plate.

18. The rail of claim 11, further comprising:
a rear support mounted on the rear bracket;
an arm connected to the rear support;
a longitudinally extending outward facing C-shaped track member connected to the inwardly facing C-shaped track member; and
the arm being slideably engaged with the outward facing C-shaped track member; wherein the slideable engagement allows the rear support to move relative to the front support such that the track assembly has an adjustable length.

\* \* \* \* \*